(12) United States Patent
Hiremath et al.

(10) Patent No.: US 12,721,087 B2
(45) **Date of Patent: *Aug. 25, 2026**

(54) HEATED LID FOR A PROCESS CHAMBER

(71) Applicant: Applied Materials, Inc., Santa Clara, CA (US)

(72) Inventors: Shivaprakash Padadayya Hiremath, Bangalore (IN); Hanish Kumar Panavalappil Kumarankutty, Bangalore (IN); Kirubanandan Naina Shanmugam, Bangalore (IN); Madhukar Krishna, Bengaluru (IN); Sriharsha Dharmapura Sathyanarayanamurthy, Bengaluru (IN); Sriharish Srinivasan, Bangalore (IN)

(73) Assignee: Applied Materials Inc., Santa Clara, CA (US)

( * ) Notice: Subject to any disclaimer, the term of this patent is extended or adjusted under 35 U.S.C. 154(b) by 829 days.

This patent is subject to a terminal disclaimer.

(21) Appl. No.: 17/470,418

(22) Filed: Sep. 9, 2021

(65) Prior Publication Data

US 2023/0073150 A1 Mar. 9, 2023

(51) Int. Cl.
*H01L 21/67* (2006.01)
*H10P 72/00* (2026.01)

(52) U.S. Cl.
CPC ...... *H10P 72/0432* (2026.01); *H10P 72/0452* (2026.01)

(58) Field of Classification Search
CPC ............... C23C 16/46; H01L 21/67098; H01L 21/67109
See application file for complete search history.

(56) References Cited

U.S. PATENT DOCUMENTS

2003/0116087 A1* 6/2003 Nguyen ............ C23C 16/45565 438/791
2005/0000423 A1 1/2005 Kasai et al.
(Continued)

FOREIGN PATENT DOCUMENTS

KR 10-2014-0067365 A 6/2014
KR 20180134807 A 12/2018
KR 10-1929473 B1 3/2019

OTHER PUBLICATIONS

U.S. Appl. No. 17/470,294, filed Sep. 9, 2021, Rice et al.
PCT International Seach Report and Written Opinion for PCT/US2022/042934 dated Dec. 29, 2022.

*Primary Examiner* — Parviz Hassanzadeh
*Assistant Examiner* — Nathan K Ford
(74) *Attorney, Agent, or Firm* — Moser Taboada

(57) ABSTRACT

Embodiments of heated lids for a process chamber are provided herein. In some embodiments, a heated lid includes: a body having a central region and a peripheral region, wherein the body includes a central opening in the central region, wherein the peripheral region includes a plurality of vertical slots that extend into an upper surface of the body and arranged along a circle to provide a thermal break, and wherein the body includes one or more annular plenums that extend into the upper surface of the body and a plurality of holes extending through a bottom surface of the one or more annular plenums to a lower surface of the body; a first heater ring having one or more heating elements disposed therein, wherein the first heater ring is coupled to the central region of the body; and a second heater ring having one or more heating elements disposed therein.

16 Claims, 8 Drawing Sheets

(56) References Cited

U.S. PATENT DOCUMENTS

2005/0109276 A1 5/2005 Iyer et al.
2007/0275178 A1* 11/2007 Nishi ................ H01L 21/67748 427/430.1
2009/0081878 A1* 3/2009 Dhindsa ............ H01J 37/32091 156/345.34
2011/0061810 A1* 3/2011 Ganguly ............. H01L 21/0223 156/345.27
2011/0143551 A1* 6/2011 Borean ............... C23C 16/4557 438/758
2015/0059981 A1* 3/2015 Huston ................... C23C 16/46 118/733
2015/0184301 A1 7/2015 Saido
2015/0187612 A1 7/2015 Obweger
2016/0097119 A1 4/2016 Cui et al.
2019/0078210 A1 3/2019 Gungor et al.
2019/0119816 A1* 4/2019 Zhang ................. C23C 16/4557
2019/0226088 A1* 7/2019 Zhang ................. C23C 16/4557

* cited by examiner

HEATED LID FOR A PROCESS CHAMBER

FIELD

Embodiments of the present disclosure generally relate to a substrate processing equipment.

BACKGROUND

Many microelectronic device fabrication processes are performed via a process chamber, for example, to form thin layers of material on a substrate or to coat parts or components for use in microelectronic device fabrication. The process chamber may be a deposition chamber, for example, an atomic layer deposition (ALD) chamber. The process chamber generally includes a chamber body and a lid disposed on the chamber body to define an interior volume therein. An o-ring may be disposed at an interface between the chamber body and the lid. A showerhead may be coupled to the lid and disposed in the interior volume to provide one or more process gases to facilitate deposition of the thin layer of material. The showerhead may need to be heated to a certain temperature to perform certain deposition processes. The lid may be heated to heat the showerhead to a desired temperature. However, high temperatures at an outer periphery of the lid may compromise the integrity of the o-ring disposed between the chamber body and the lid. Further, high temperatures at an outer periphery of the lid lead to increased heat loss from outer sidewalls of the lid.

Therefore, the inventors have provided improved heated lids for use with a process chamber.

SUMMARY

Embodiments of heated lids for a process chamber are provided herein. In some embodiments, a heated lid for a process chamber includes: a body having a central region and a peripheral region, wherein the body includes a central opening in the central region, wherein the peripheral region includes a plurality of vertical slots that extend into an upper surface of the body and arranged along a circle to provide a thermal break, and wherein the body includes one or more annular plenums that extend into the upper surface of the body and a plurality of holes extending through a bottom surface of the one or more annular plenums to a lower surface of the body; a first heater ring having one or more heating elements disposed therein, wherein the first heater ring is coupled to the central region of the body; and a second heater ring having one or more heating elements disposed therein, wherein the second heater ring is coupled to the central region of the body and disposed radially outward of the first heater ring and radially inward of the one or more annular plenums.

In some embodiments, a heated lid for a process chamber, includes: a body having a central region and a peripheral region, wherein the body includes a central opening in the central region, wherein the peripheral region includes a plurality of vertical slots that extend from an upper surface of the body to provide a thermal break and a plurality of horizontal slots extending from an outer sidewall of the body to a location radially outward of the plurality of vertical slots to provide a thermal break; a first heater ring having one or more heating elements disposed therein, wherein the first heater ring is coupled to the central region of the body; and a second heater ring having one or more heating elements disposed therein, wherein the second heater ring is coupled to the central region of the body and disposed radially outward of the first heater ring.

In some embodiments, a process chamber includes: a chamber body; and a heated lid coupled to the chamber body, wherein the chamber body and the heated lid define an interior volume therein, and wherein the heated lid comprises: a body having a central region and a peripheral region, wherein the body includes a central opening in the central region, wherein the peripheral region includes a plurality of vertical slots that extend from an upper surface of the body, and wherein the body includes an outer annular plenum that extends from the upper surface of the body and a plurality of gas supply openings extending from a bottom surface of the one or more annular plenums to a lower surface of the body; a cap covering the outer annular plenum, wherein the cap includes one or more gas inlet holes; and a first heater ring having one or more heating elements disposed therein, wherein the first heater ring is coupled to the central region of the body; and a showerhead disposed in the interior volume and coupled to the heated lid.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
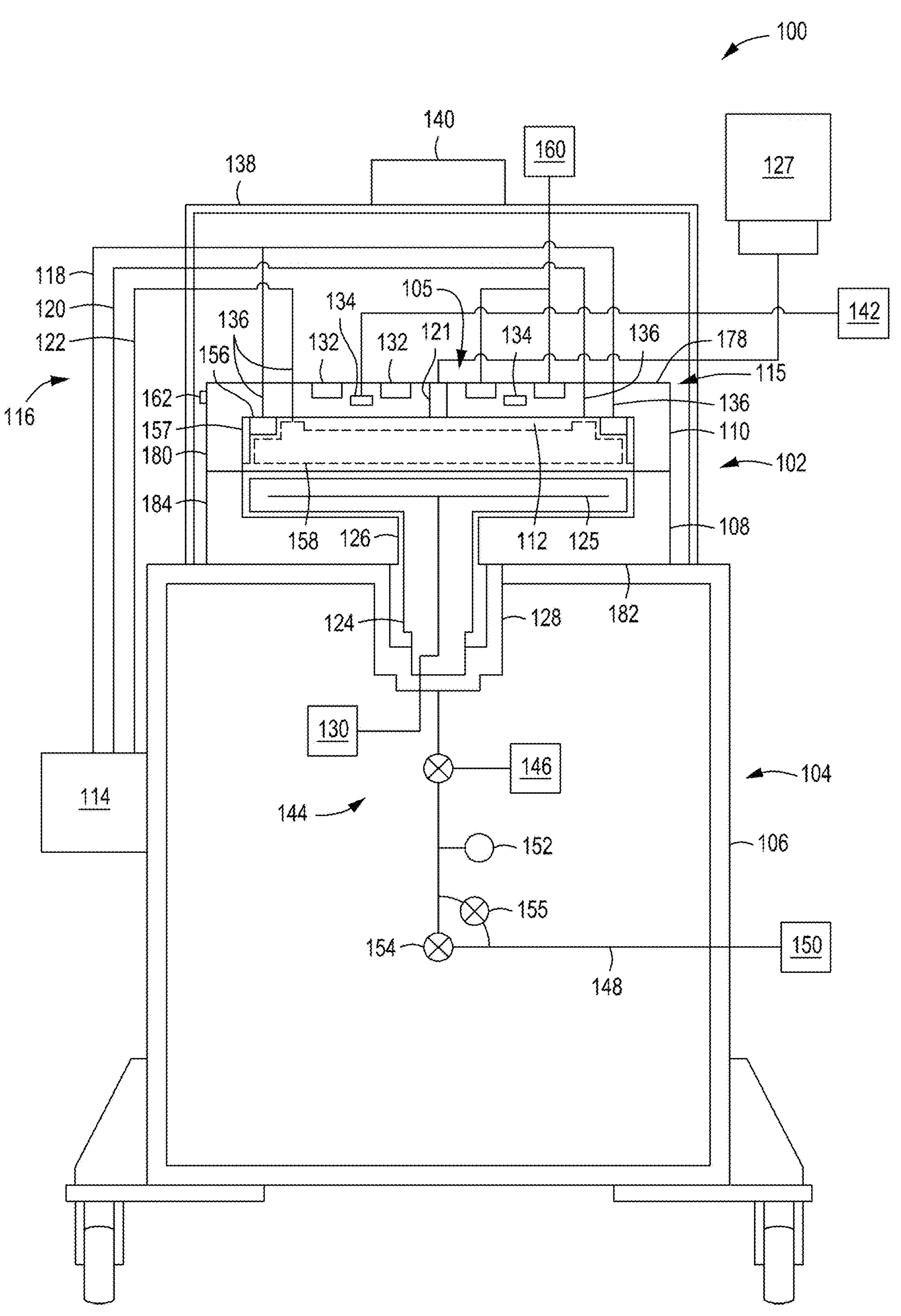
FIG. 1 depicts a schematic side view of a deposition system in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of heated lids for a process chamber are provided herein. The heated lids provided herein advantageously include thermal breaks proximate a peripheral region of the heated lids to reduce heat loss from outer sidewalls thereof. In some embodiments, the heated lid is used in a process chamber to heat a showerhead disposed therein. The process chamber may be a deposition chamber configured to perform, for example an atomic layer deposition (ALD) process.

FIG. 1 depicts a schematic side view of a deposition system in accordance with at least some embodiments of the disclosure. As depicted in FIG. 1, a deposition system 100 is shown having a process chamber 102 disposed on a support 104. The support 104 illustratively shown as including a frame assembly 106. The frame assembly 106 is depicted having wheels, but alternatively or additionally, the frame assembly 106 can include leveling feet, stabilizing brackets, or other elements to support the process chamber 102. In some embodiments, the frame assembly 106 may be omitted and the process chamber 102 can be disposed on some other type of support 104, such as by resting or mounting on another component such as, for example, a base, a transfer chamber of a cluster tool, a parts handling system for feeding and retrieving parts to/from the process chamber 102, or the like.

A cover 138 may be provided to enclose the process chamber 102. The cover 138 may be disposed on the support 104 or otherwise be coupled to the process chamber 102. The cover 138 can include a plurality of openings to facilitate airflow therethrough to cool the process chamber 102. A fan 140 may be provided to enhance air cooling of the exterior of the process chamber 102.

The process chamber 102 generally includes a chamber body 108 and a heated lid 110 that together define and enclose an interior volume 112. The interior volume may be small, such as about 1 to about 1.5 liters. Each of the chamber body 108 and the heated lid 110 may include a cavity formed in facing surfaces of the components that together define the interior volume 112 when the chamber body 108 and the heated lid 110 are assembled together. For example, the chamber body 108 may include a bottom plate 182 and a sidewall 184 extending upwardly from the bottom plate 182 and partially enclosing the interior volume 112. Similarly, the heated lid 110 may include a body 178 having a central region 105 and a peripheral region 115. The heated lid 110 may include a sidewall 180 extending downwardly in the peripheral region 115 from a lower surface 129 of the body and partially enclosing the interior volume 112. In some embodiments, each of the sidewalls 180, 184 may have the same or substantially the same dimension defining the interior volume 112 (e.g., diameter for circular chamber configurations). In some embodiments a dimension across the interior volume 112 within the sidewalls 180, 184 (e.g., an inner diameter), is about 14 to about 20 inches. The heated lid 110 and the chamber body 108 may be made of a metal such as aluminum.

Figure 3:
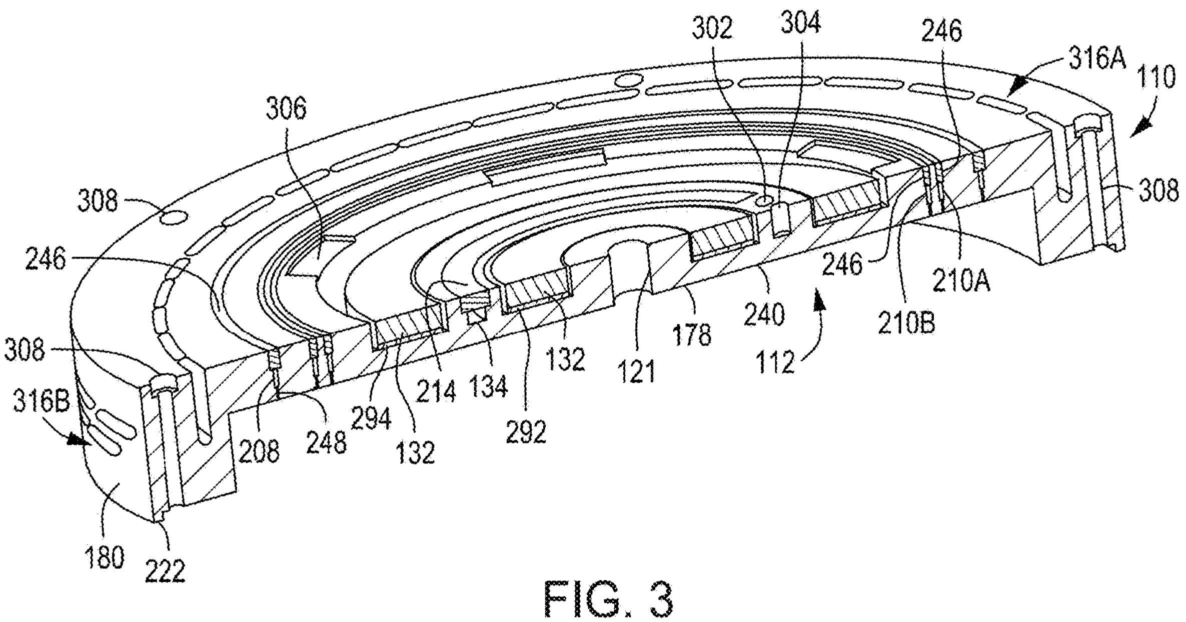
FIG. 3 depicts a top isometric view in cross-section of a portion of a heated lid of a process chamber in accordance with at least some embodiments of the present disclosure.
Figure 4:
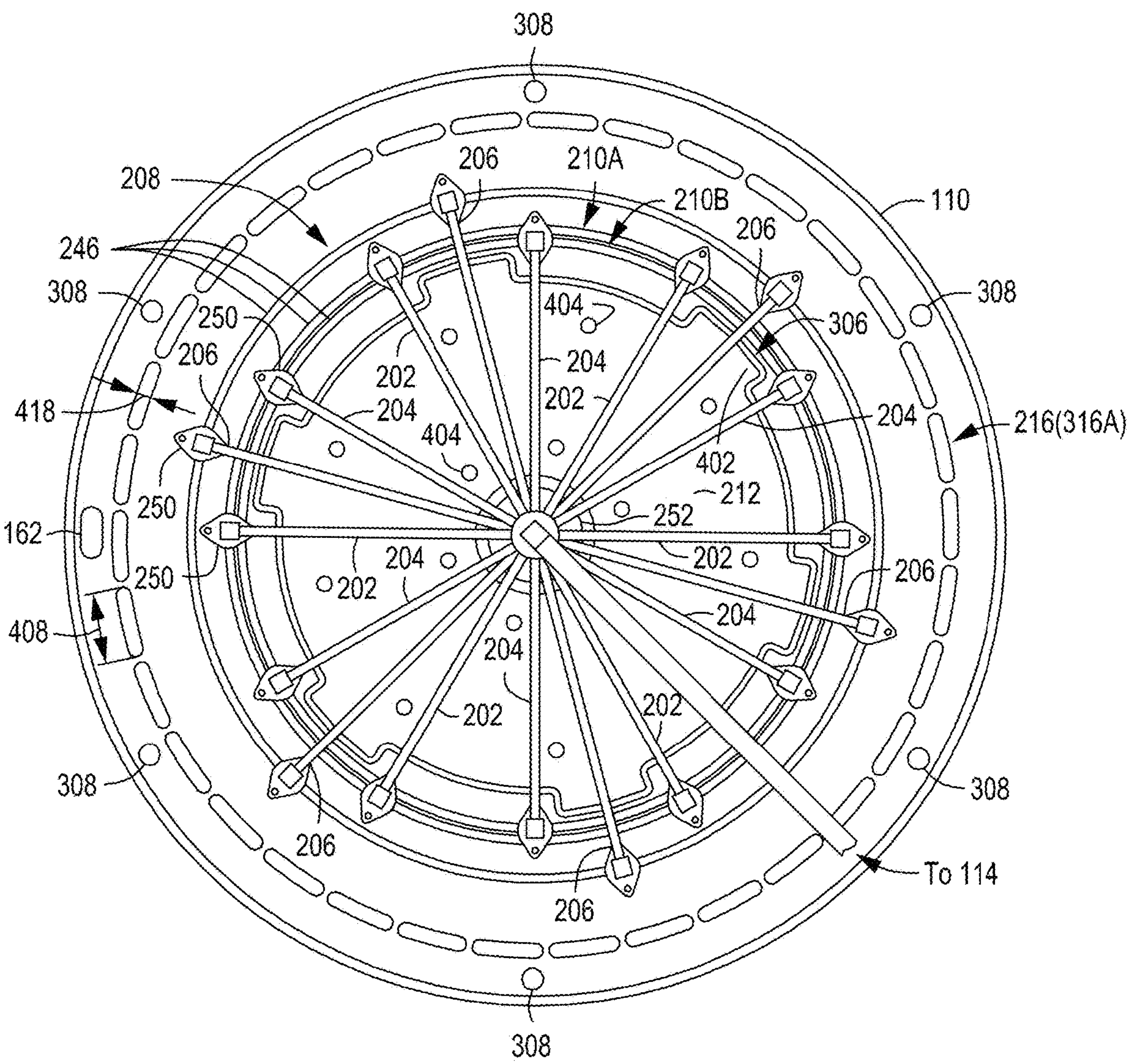
FIG. 4 depicts a top view of the process chamber in accordance with at least some embodiments of the present disclosure.

In some embodiments, the heated lid 110 and the chamber body 108 may be coupled together, for example, by clamping, bolting, screwing, or the like. For example, as shown in FIGS. 3 and 4, a plurality of holes 308 may be provided to couple the heated lid 110 to the chamber body 108, e.g., using bolts extending to corresponding threaded holes in the chamber body 108. In some embodiments, the holes 308 may be countersunk to receive the heads of corresponding bolts, screws, or the like. The plurality of holes 308 may be arranged to provide a uniform seal between the heated lid 110 and chamber body 108, e.g., to prevent leakage of gases provided to the interior volume 112. A lift system (not shown), may be provided to lift the heated lid 110 to facilitate insertion and removal of a workpiece to be coated or for other maintenance or actions that require access to the interior volume 112. The heated lid 110 and the chamber body 108 can be made from any suitable process compatible materials, such as aluminum or stainless steel.

Figure 2:
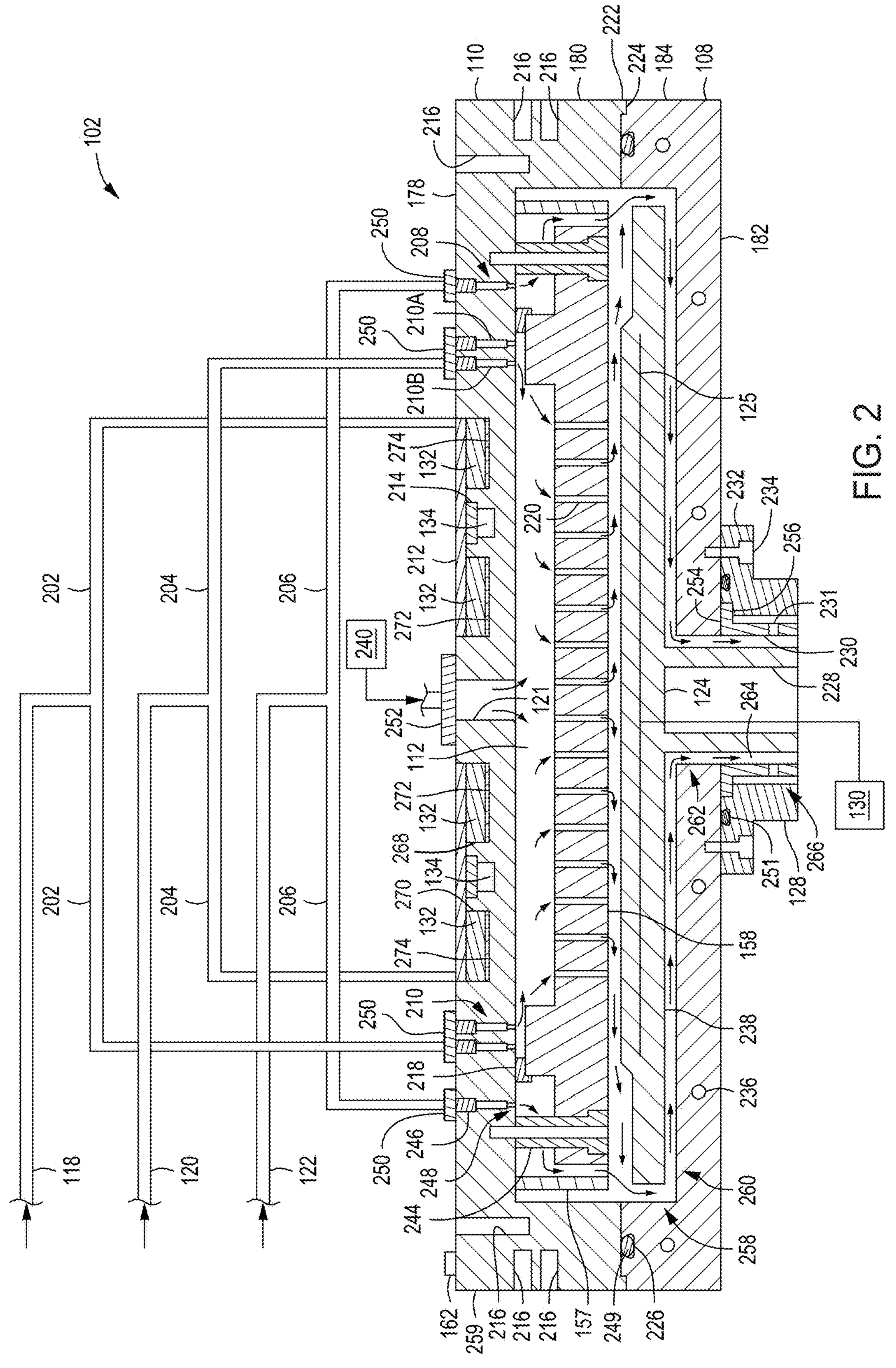
FIG. 2 depicts a schematic cross-sectional side view of a portion of a process chamber in accordance with at least some embodiments of the present disclosure.

The heated lid 110 includes one or more heaters 132. The one or more heaters 132 may be coupled to a heater power source 160. In some embodiments, the one or more heaters 132 comprise ring-shaped heaters disposed in annular channels in an upper surface 123 of the heated lid 110 (e.g., in a top surface of the body 178). For example, as depicted in FIGS. 2-3, the one or more heaters 132 comprise a first heater ring 272 disposed in a first annular channel 268 and a second heater ring 274 disposed in a second annular channel 270. In some embodiments, the second heater ring 274 is coupled to the central region 105 of the body 178 and disposed radially outward of the first heater ring 272. In some embodiments, the first heater ring 272 and the second heater ring 274 are disposed in annular channels formed in the upper surface 123 of the heated lid 110. The first heater ring 272 and the second heater ring 274 may have one or more heating elements disposed therein. In some embodiments, the first heater ring 272 and the second heater ring 274 are made of a metal, such as aluminum.

In some embodiments, a first conductive ring 292 is disposed in the first annular channel 268 between the first heater ring 272 and the body 178 to enhance thermal coupling between the first heater ring 272 and the body 178. In some embodiments, a second conductive ring 294 is disposed in the second annular channel 270 between the second heater ring 274 and the body 178 to enhance thermal coupling between the second heater ring 274 and the body 178. In some embodiments, the first conductive ring 292 and the second conductive ring 294 are made of graphite. In some embodiments, the first heater ring 272 and the second heater ring 274 are coupled to the body 178 via the first conductive ring 292 and the second conductive ring 294, respectively, without directing contacting the body 178.

An center cap 212 may be disposed over each of the one or more heaters 132 to retain the heaters within the annular channel. In some embodiments, the center cap 212 can span over the one or more heaters 132 and one or more coolant channels 134 that may be disposed in the heated lid 110. As depicted in FIGS. 3 and 4, a plurality of receptacles 306 may be formed in the upper surface 123 of the heated lid 110 to receive corresponding protrusions 402 from the center cap 212. The center cap 212 can be secured to the body 178 of the heated lid 110, for example by a plurality of fasteners 404 (e.g., bolts, screws, or the like).

One or more coolant channels 134 may be provided in the heated lid 110 to flow a heat transfer medium therethrough. For example, a coolant source 142 can be coupled to the one or more coolant channels 134 to circulate a coolant therethrough. The coolant may be a liquid or a gas. In some embodiments, the coolant comprises air. In some embodiments, for example shown in FIG. 2, the one or more coolant channels 134 may comprise a first coolant channel formed in a top of the heated lid 110 with a cap 214 disposed over the first coolant channel. In some embodiments, for example when the one or more heaters 132 comprise a pair of heaters 132, at least one (and in some embodiments all) of the one or more coolant channels 134 may be disposed between the pair of heaters 132 (i.e., between the first heater ring 272 and the second heater ring 274). In some embodiments, for example as depicted in FIG. 3, the one or more coolant channels 134 may be a singular annular channel having an inlet 302 and an outlet 304 coupled to a coolant source, such as the coolant source 142 depicted in FIG. 1, for circulating a coolant through the coolant channel 134 (e.g., the singular annular channel). In some embodiments, the coolant source 142 and coolant channels 134 are configured to maintain a temperature of the heated lid 110 at about 50 to about 75 degrees Celsius.

In some embodiments, one or more coolant channels 236 may be provided in the chamber body 108 to flow a heat transfer medium therethrough. For example, the coolant source 142, or another coolant source (not shown) can be coupled to the one or more coolant channels 236 to circulate a coolant therethrough. In some embodiments, the coolant source 142 (or other different source) and coolant channels 236 are configured to maintain a temperature of the chamber body 108 at about 50 to about 75 degrees Celsius. The small volume and configuration of the coolant channels 134, 236 advantageously facilitate rapid cooldown of the process chamber 102 to remove a finished workpiece and load a new workpiece, thus enhancing throughput.

Figure 7:
FIG. 7 depicts a top view of a heated lid in accordance with at least some embodiments of the present disclosure.
Figure 7:
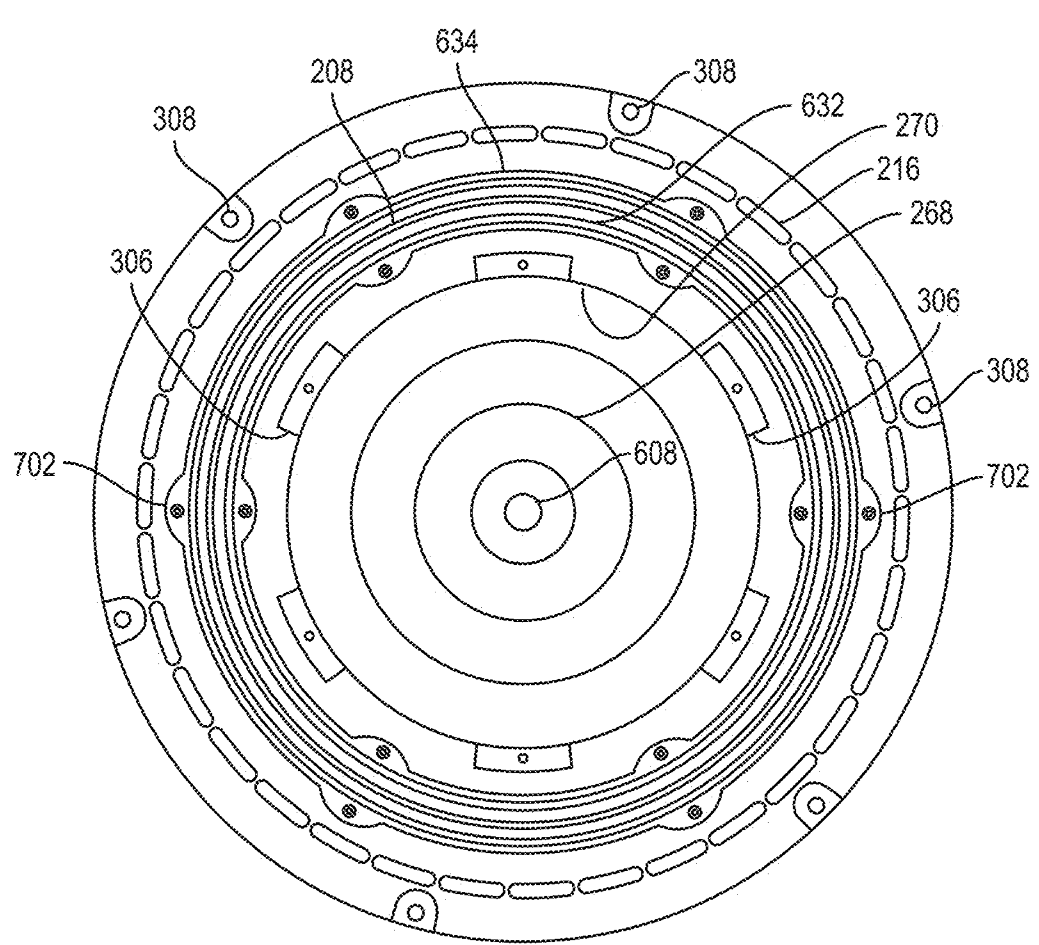

Returning to FIG. 1, a thermostat 162 may be disposed in or coupled to the heated lid 110 to monitor the temperature of the heated lid 110 and, in some embodiments, to facilitate feedback control of the temperature during use. The thermostat 162 may be provided in any suitable location for monitoring the temperature of the heated lid 110, such as on a side of the heated lid 110 (as depicted in FIG. 1), or on a top surface of the heated lid 110 (as depicted in FIGS. 2 and 7).

The heated lid 110 includes a plurality of gas passages 136 disposed therethrough to facilitate providing one or more gases to the interior volume 112 of the process chamber 102. A gas source 114 is fluidly coupled to the interior volume 112 via a plurality of conduits 116 coupled to the plurality of gas passages 136 to provide process gases to the interior volume 112 during operation, such as an ALD operation to coat a workpiece (or substrate) disposed in the interior volume 112. For example, the gas source may include precursor ampoules, one or more inert gases, as well as high speed pulsing valves, purge valves, or the like, to provide deposition gases, carrier gases, purge gases, and the like, for performing an ALD process. For example, as shown in FIG. 1, a first conduit 118, a second conduit 120, and a third conduit 122 can be provided to supply three different gases to the interior volume 112, such as for example, a first precursor, a second precursor, and an inert gas. The first conduit 118, the second conduit 120, and the third conduit 122 can be coupled to the interior volume 112 through the heated lid 110, for example, through the plurality of gas passages 136.

In one example, the coating to be formed can be an aluminum oxide ($Al_2O_3$) coating. In such embodiments, for example, the gas source can be configured to provide deposition gases (e.g., precursor gases) including trimethylaluminum (TMA) and water ($H_2O$) along with inert gases, such as nitrogen ($N_2$) or a noble gas, for example, argon (Ar), or the like.

In some embodiments, the process chamber 102 is configured to deliver the one or more process gases in a distributed manner. For example, in some embodiments, the process chamber 102 is configured to deliver the one or more process gases into a plurality of zones of the interior volume 112. For example, the heated lid 110 can include one or more annular plenums that are fluidly independent each coupled to the gas source 114. Each of the one or more annular plenums are configured to provide one or more process gases to a particular zone of the interior volume 112, wherein at least some of the particular zones are different from each other. The one or more annular plenums advantageously provide separation of gases to prevent undesired reaction and/or deposition within the conduits or heated lid 110.

For example, as depicted in FIG. 2, the heated lid 110 can include an outer annular plenum 208 and one or more inner annular plenums 210. The outer annular plenum 208 facilitates providing one or more gases to a peripheral region of the interior volume 112, and a peripheral region of the workpiece to be coated. In some embodiments, for example, an inert gas may be provided to the outer annular plenum 208 to prevent deposition on the peripheral portion of the workpiece and/or on peripheral portions of the interior volume 112. In the embodiment depicted in FIG. 2, two inner annular plenums 210 are shown. The inner annular plenums facilitate providing one or more gases, such as different deposition or precursor gases for an ALD process, to a more radially inner portion of the interior volume proximate regions of the workpiece that are desired to be coated. In some embodiments, the first heater ring 272 and the second heater ring 274 are disposed radially inward of the one or more annular plenums.

The one or more annular plenums may be formed, for example, by respective annular channels disposed in the top surface of the body 178. An annular cap 246 may be disposed atop each channel to define the respective plenum. A plurality of holes 248 may be provided in each annular plenum, for example along a bottom surface of the annular plenum to the lower surface 129 of the body 178, to fluidly couple the annular plenum to the interior volume 112. The plurality of holes 248 can be sized and arranged to provide a suitable gas flow from the plenum into the interior volume 112. In some embodiments, the plurality of holes 248 can be equidistantly or substantially equidistantly spaced along the annular plenum. In some embodiments, the plurality of holes 248 can be arranged into sets of holes, with each set of holes equidistantly or substantially equidistantly spaced along the annular plenum.

Each of the annular plenums may be coupled to the gas source 114 via different ones of the first, second, or third conduits 118, 120, 122. For example, a first annular plenum 210A of the one or more inner annular plenums 210 may be coupled to the gas source 114 via the first conduit 118. A second annular plenum 2106 of the one or more inner annular plenums 210 may be coupled to the gas was 114 via the second conduit 120. The outer annular plenum 208 may be coupled to the gas source 114 via the third conduit 122.

As best depicted in FIGS. 2 and 4, the first conduit 118 may be coupled to one of the inner annular plenums 210 (e.g., 210A) via a plurality of legs 202 (e.g., a first plurality of legs). Similarly, the second conduit 120 may be coupled to a different one of the inner annular plenums 210 (e.g., 2106) via a different plurality of legs 204 (e.g., a second plurality of legs). Similarly, the third conduit 122 may be coupled to the outer annular plenum 208 via a different plurality of legs 206 (e.g., a third plurality of legs). Each of the plurality of legs 202, 204, 206, are fluidly coupled to the respective inner annular plenums 210A, 210B, and outer annular plenum 208. In some embodiments, one or more of the first conduit 118, the second conduit 120, or the third conduit 122 may be coupled to the respective plenums in a plurality of locations along the plenums. The plurality of locations can be two or more locations, three or more locations, four or more locations, or the like. For example, and as depicted in FIG. 4, the plurality of locations can be six locations.

In some embodiments, at least one, and in some embodiments all, of the first conduit 118, the second conduit 120, or the third conduit 122 are coupled to the respective plenums in an azimuthally symmetric manner. In some embodiments, each of the locations within a respective plenum is equidistantly spaced from adjacent locations within the respective plenum. In some embodiments, none of the plurality of locations are radially aligned with respect to each other. For example, as best shown in FIG. 4, each plenum includes a plurality of inlets that can be equidistantly spaced from each other. Each of the inlets in each plenum can be angularly offset with respect to each other. In some embodiments, there are an equal number of inlets in each plenum. Each of the first, second, or third conduits 118, 120, or 122 may be coupled to the respective plenums via a fitting 250 disposed on the end of each conduit that aligns the conduit with an inlet to the plenum. For example, as depicted in FIG. 2, a fitting 250 is disposed at the end of each of the pluralities of legs 202, 204, 206. Each annular cap 246 includes one or more gas inlet holes to accommodate the fitting 250 and the inlet to the plenum.

Referring back to FIG. 1, in some embodiments, a remote plasma source (RPS) 127 can be coupled to the interior volume 112, for example, via a central opening 121 in the central region 105 of the heated lid 110 to facilitate cleaning of the process chamber 102 when desired. Alternatively, or in combination, the gas source 114 can be coupled to the interior volume 112 (e.g., via the first conduit 118, the second conduit 120, and the third conduit 122) through the central opening 121. For example, as shown in FIG. 2, the central opening 121 can be coupled to a gas source 240. The gas source 240 can include one or more of the gas source 114 or the RPS 127. In some embodiments, the central opening is coupled to the gas source 240 via a cap 252. In some embodiments, the cap 252 can be configured similar to the annular cap 246, described above.

In some embodiments, one or more mounting brackets 156 are provided to facilitate coupling a showerhead 158 to the heated lid 110. In some embodiments, the showerhead 158 partially defines a processing volume portion of the interior volume 112. The showerhead 158 may comprise a bottom plate having a peripheral lip extending away from the bottom plate to define a central recess within the peripheral lip. A plurality of gas distribution holes 220 are disposed through the bottom plate to facilitate flow of gases from the central recess through the bottom plate and to a space on an opposing side of the bottom plate (e.g., to a processing volume of a chamber having the showerhead installed therein). The showerhead 158 may be coupled to the heated lid 110 such that the bottom plate of the showerhead 158 is spaced about 1 to about 5 mm, such as about 3 mm apart from a support surface of a pedestal heater 124 disposed in the process chamber 102. The showerhead may include a plurality of openings through the bottom plate, radially outward of the peripheral lip to facilitate coupling the workpiece to the heated lid 110 via the mounting bracket 156.

For example, in some embodiments, the one or more mounting brackets 156 can be a plurality of posts, such as posts 244 depicted in FIG. 2. The showerhead 158 can be coupled to the heated lid 110 via the plurality of posts 244. For example, the plurality of posts 244 can be inserted into existing mounting holes in the showerhead 158 and includes through holes for bolting the showerhead 158 to mating threaded openings in the heated lid 110.

Still with reference to FIG. 2, in some embodiments, a spacer 218 may be provided to facilitate maintaining a gap between the showerhead 158 and the heated lid 110. The gap between the showerhead 158 and the heated lid 110 facilitates gas flow therebetween. The spacer 218 may further facilitate forming a seal between the showerhead 158 and the heated lid 110 such that gases provided to the interior volume 112 substantially flow toward and over the surfaces of the showerhead 158 disposed radially inward of the spacer 218, and not around the radially outer surfaces of the showerhead 158. In some embodiments, the spacer 218 is made of polyetheretherketone (PEEK), aluminum, such as Al6061 or Al1005, or similar material.

In some embodiments, the spacer 218 has a size such that the spacer 218 is disposed between the outer annular plenum 208 and one or more inner annular plenums 210. In operation, for example, process gases for a deposition process (e.g., deposition gases), such as an ALD deposition process, may be provided to the one or more inner annular plenums 210 (or through the central opening 121), while an inert gas, such as a noble gas, for example argon, can be provided to the outer annular plenum 208. Process gases provided to the one or more inner annular plenums 210 (or through the central opening 121) thus flow over radially inner (relative to the spacer 218) surfaces of the showerhead 158, and through openings in the showerhead 158 (such as gas distribution holes 220). The process gases provided to the one or more inner annular plenums 210 (or through the central opening 121) are substantially prevented from flowing radially outward of the spacer 218 and over radially outer surfaces (relative to the spacer 218) of the showerhead 158. Similarly, gases, such as an inert gas, provided to the outer annular plenum 208 flows over the radially outer surfaces of the showerhead 158 and are substantially prevented from flowing over radially inner surfaces of the showerhead 158. An inert gas provided to the outer annular plenum 208 further limits or prevents deposition of materials along outer sidewalls of the heated lid 110. Illustration of gas flows into and out of the process chamber 102 are depicted by arrows shown in FIG. 2.

Returning to FIG. 1, in some embodiments, a liner 157 is provided to surround the showerhead 158 to protect the heated lid 110. The liner 157 can have any suitable shape to surround the showerhead 158 and protect the inner sidewalls of the heated lid 110 (e.g., the outer periphery of the interior volume adjacent to the heated lid).

The chamber body 108 is sized and configured to receive a pedestal heater 124. For example, the chamber body 108 may include an opening 126 formed through the bottom plate 182 to receive a shaft (e.g., shaft 228 depicted in FIG. 2) of the pedestal heater 124. A pedestal hub 128 can be coupled to the bottom plate 182 to surround and enclose the shaft of the pedestal heater 124. In some embodiments, the shaft of the pedestal heater 124 may be coupled to and supported by the pedestal hub 128 such that a bottom surface of the pedestal heater 124 is disposed above and opposing top surface of the bottom plate 182 of the chamber body 108.

A pedestal heater power supply 130 is coupled to a heater electrode 125 disposed in the pedestal heater 124, for example, through the pedestal hub 128, to power the pedestal heater 124 during use. The heater electrode 125 can be configured in one or a plurality of zones, such as two zones. In some embodiments, the pedestal heater 124 is configured to heat up to about 600 degrees Celsius. In some embodiments, the pedestal heater 124 is configured to heat up from about 200 to about 500 degrees Celsius. As shown in FIG. 2, the pedestal heater 124 may include a heater plate 238 and a shaft 228. The heater plate 238 includes the heater electrode 125 and may include a substantially planar upper surface. In some embodiments, the heater plate may be configured to support a planar substrate, such as a semiconductor wafer or the like. In some embodiments, the heater plate 238 may include a planar or substantially planar raised upper surface and a substantially planar ledge disposed radially outward of the raised upper surface. The pedestal heater 124 can have a diameter that is larger than the showerhead 158. In some embodiments, the pedestal heater 124 can have a diameter of about 500 to about 600 mm.

The chamber body 108 is sized to define a small gap between the pedestal heater 124 and interior volume 112 facing surfaces of the chamber body 108. For example, a first gap 258 is formed between the inner surface of the sidewall 184 and the outer peripheral edge of the heater plate 238. In some embodiments, the first gap 258 can be about 2 to about 4 mm, such as about 3 mm. A second gap 260 is formed between the upper surface of the bottom plate 182 and an opposing lower surface of the heater plate 238. In some embodiments, the second gap 260 can be about 3 to about 6 mm, such as about 4 mm. The opening 126 is larger than the outer diameter of the shaft 228 such that a third gap 262 is formed between the opening 126 and the shaft 228. In some embodiments, the third gap 262 can be about 3 to about 6 mm, such as about 4 mm.

The pedestal hub 128 is coupled to the chamber body 108 about the shaft 228 and opening 126. The pedestal of 128 can be bolted or otherwise fastened to the chamber body 108, for example, using a plurality of fasteners disposed through a corresponding plurality of openings 234 formed in a flange 232 of the pedestal hub 128 and extending into corresponding threaded openings of the chamber body 108. In some embodiments, one or more grooves 251 may be provided in either or both of the pedestal hub 128 or the chamber body 108 to facilitate forming a seal therebetween. For example, a gasket, such as in O-ring, may be disposed in the groove 251.

In some embodiments, choke cup 230 may be provided to regulate the flow the exhaust of gases leaving the interior volume 112. The choke cup 230 can be disposed between the pedestal hub 128 and the chamber body 108. The choke cup 230 provides flow conductance choke points to regulate the flow exiting the process chamber to be more azimuthally uniform. For example, the choke cup 230 may be a tubular member including a flange 254 that may rest on a corresponding ledge 256 formed along the inner diameter of the pedestal hub 128. The flange 254 may have a thickness that is equal to or substantially equal to a height of the ledge 256 such that the flange 254 rests against the bottom of the chamber body 108 when the pedestal hub 128 is coupled thereto.

The choke cup 230 may have an inner diameter that is substantially equal to the inner diameter of the opening 126 to define a fourth gap 264 between the inner surfaces of the choke cup 230 and the outer surface of the shaft 228. The choke cup 230 further has an outer diameter that is less than an inner diameter of the pedestal hub 128 such that a fifth gap 266 is defined therebetween. The choke cup 230 further includes a plurality of openings 231 formed therethrough to fluidly couple the fourth gap 264 to the fifth gap 266.

Returning to FIG. 1, the exhaust assembly 144 of the process chamber 102 is fluidly coupled to the interior volume 112 through the pedestal hub 128. The exhaust assembly 144 includes a throttle valve 146 disposed in line along a conduit 148 coupling a pump 150 to the interior volume 112. The throttle valve 146 facilitate control of the pressure within the interior volume 112. A pressure gauge 152 may also be coupled to the conduit 148 to monitor a pressure in the conduit 148 (and, by relation, the pressure within the interior volume). In some embodiments, additional valves, for example such as an isolation valve 154, a bypass valve 155, or the like, may be provided to facilitate isolating and/or disconnecting the process chamber 102 from the conduit 148 and pump 150, for example for maintenance.

As depicted in FIG. 2, the heated lid 110 is coupled to the chamber body 108 to at least partially define the interior volume 112. In some embodiments, a seal may be provided at the interface between the heated lid 110 and the chamber body 108. For example, a groove 226 may be provided in one or more of the heated lid 110 or the chamber body 108 to receive a gasket, for example an O-ring 249, to facilitate maintaining a seal between the heated lid 110 and the chamber body 108 when assembled. In some embodiments, one more alignment features may be provided to facilitate the alignment and interconnection of the heated lid 110 and the chamber body 108. For example, a protrusion or lip 222 may be disposed around a peripheral edge of one of the heated lid 110 or the chamber body 108. A mating recess 224 may be provided in the other of the heated lid 110 or the chamber body 108 to receive and interface with the lip 222. In the embodiment depicted in FIG. 2, the lip 222 is shown protruding downward from the heated lid 110 and the mating recess 224 is shown formed in the peripheral edge of the chamber body 108.

One or more thermal conduction chokes (i.e. thermal breaks) may be provided in the heated lid 110 to advantageously facilitate reduction of heat transfer away from the upper central portion of the heated lid, above the interior volume 112. The thermal breaks advantageously maintain integrity of the O-ring 249 and the seal between the heated lid 110 and the chamber body 108 when the central region 205 of the heated lid 110 is heated to high temperatures (i.e., above about 225 degrees Celsius). The thermal breaks may advantageously maintain a temperature at the peripheral region 215 of the heated lid 110 below about 80 degrees Celsius while the central region 205 of the heated lid 110 at above about 225 degrees Celsius. For example, a plurality of slots 216 may be formed in the peripheral region 115 of the heated lid 110 to interfere with conductive heat transfer through the heated lid 110. In some embodiments, the plurality of slots 216 comprise elongate slots. The plurality of slots 216 can be formed in either or both of the upper surface 123 or side surfaces of the heated lid 110.

Figure 5:
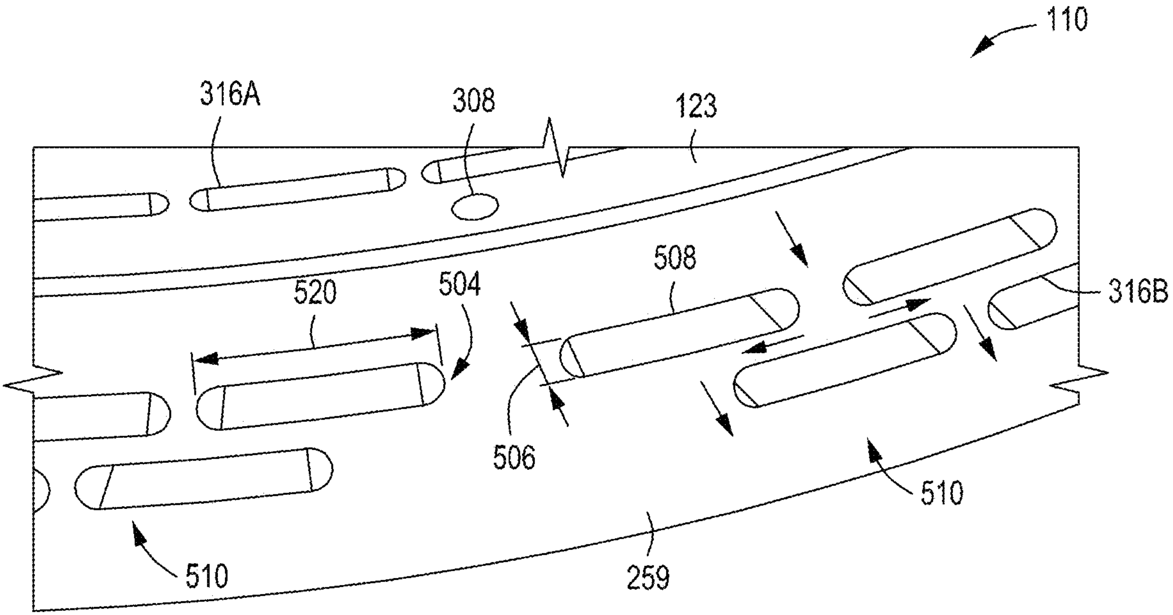
FIG. 5 depicts a top isometric view of a portion of a heated lid of a process chamber in accordance with at least some embodiments of the present disclosure.

In the embodiment depicted in FIG. 2, and as shown more clearly in FIGS. 3, 4, and 5, the plurality of slots 216 may include a plurality of vertical slots 316A (see FIG. 3) formed in the upper surface 123 of the heated lid 110. The plurality of vertical slots 316A may be arranged, for example, along a circle in the peripheral region 115 of the body 178 proximate an outer peripheral edge of the heated lid 110 and radially outward of the interior volume 112. In some embodiments, the plurality of vertical slots 316A are disposed about 1.0 inches to about 1.3 inches from the outer peripheral edge of the heated lid 110. In some embodiments, the plurality of vertical slots 316A may be elongate slots having major axes aligned or substantially aligned with the circle along which they are disposed (e.g., tangentially aligned with the circle, for example, at the center of the elongate slot). In some embodiments, the plurality of vertical slots 316A have a length 408 of about 2.0 inches to about 3.0 inches, such as, for example, about 2.25 inches to about 2.3 inches. In some embodiments, the plurality of vertical slots 316A have a width 418 of about 0.25 inches to about 0.75 inches. In some embodiments, the plurality of vertical slots 316A have a width 418 of about 0.35 inches to about 0.45 inches.

In the embodiment depicted in FIG. 2, and as shown more clearly in FIGS. 3 and 5, the plurality of slots 216 may include a plurality of horizontal slots 316B formed in the outer sidewall 259 of the heated lid 110. In some embodiments, the plurality of horizontal slots 316B extend from the outer sidewall 259 to a location radially outward of the plurality of vertical slots 316A. In some embodiments, the plurality of horizontal slots 316B have a width 520 of about 1.9 inches to about 2.5 inches. In some embodiments, the plurality of horizontal slots 316B have a height 506 of about 0.25 inches to about 0.50 inches.

The plurality of horizontal slots 316B may be arranged, for example, as shown in FIG. 5, along one or more circular rows that are vertically spaced along the outer sidewall 259 of the heated lid 110. In embodiments where more than one circular row of horizontal slots are provided, the slots in each row may be staggered or overlap to reduce the pathways for conductive heat transfer from the upper surface 123 of the heated lid 110 down the side surface of the heated lid 110 (e.g., to form a tortuous path for thermal conduction). In some embodiments, the plurality of vertical slots 316A extend down past an upper surface 508 of an uppermost circular row 504 of the plurality of horizontal slots 316B.

Arrows extending between the plurality of horizontal slots 316B in FIG. 5 depict an example of a tortuous path for thermal conduction. In some embodiments, the plurality of horizontal slots 316B may be elongate slots having major axes aligned or substantially aligned with the circular row along which they are disposed. In some embodiments, the plurality of horizontal slots 316B are arranged in a plurality of slot clusters 510, separated at a location corresponding with a hole of the plurality of holes 308. In some embodiments, the plurality of slot clusters 510 are disposed at regular intervals about the heated lid 110.

In operation, when gases are flowing through the process chamber 102, the gases initially flow into the process chamber 102 through the heated lid 110. For example, gases can be introduced through at least one of the gas passages 136 or the opening 126. The gases then flow around and through the showerhead 158. The gases then flow around peripheral edges of the pedestal heater 124 (e.g., through first gap 258), between the bottom of the pedestal heater 124 and the floor of the chamber body 108 (e.g., through second gap 260), and are exhausted out of the interior volume 112 through a location beneath the pedestal heater 124, such through the choke cup 230 and pedestal hub 128 (e.g., through the third gap 262, fourth gap 264, and fifth gap 266). A pump, such as the pump 150 is coupled to the interior volume 112, for example, through the pedestal hub 128.

Figure 6:
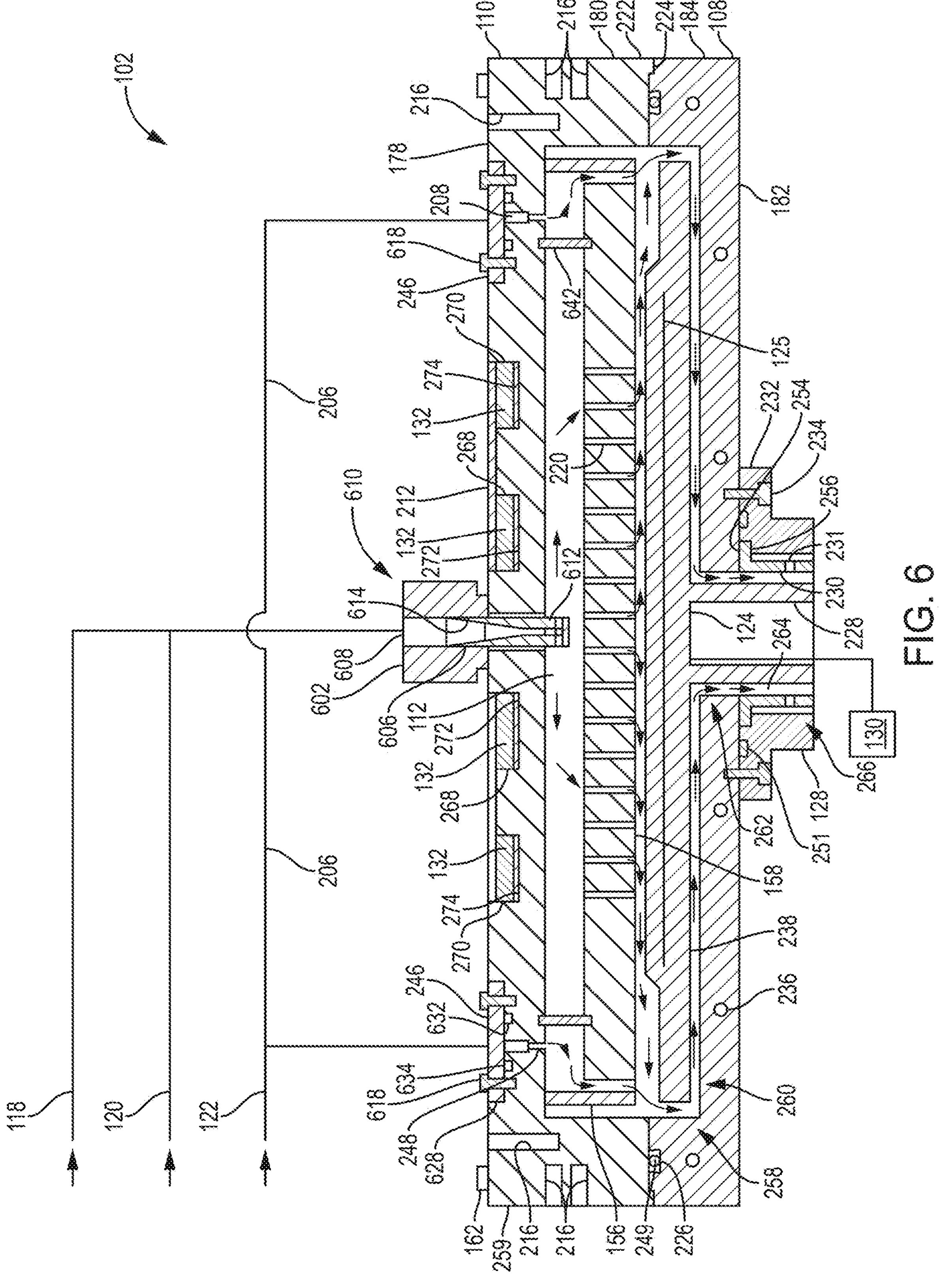
FIG. 6 depicts a schematic cross-sectional side view of a portion of a process chamber in accordance with at least some embodiments of the present disclosure.

FIG. 6 depicts a schematic cross-sectional side view of a portion of a process chamber 102 in accordance with at least some embodiments of the present disclosure. In some embodiments, as shown in FIG. 6, the first conduit 118 and the second conduit 120 are centrally fed to the heated lid 110. For example, in some embodiments, the heated lid 110 includes a central manifold 610 coupled to the body 178 and having a central gas inlet 608. In some embodiments, the central manifold 610 includes a feed block 602 and a central feed baffle 606 at least partially disposed in the feed block 602. The first conduit 118 may be configured to deliver the first precursor. The second conduit 120 may be configured to deliver the second precursor. In some embodiments, the first and second precursors may be trimethylaluminum (TMA) and water ($H_2O$), respectively. In some embodiments, the heated lid 110 does not include the one or more coolant channels 134.

In some embodiments, the central feed baffle 606 includes a central opening 614 aligned with the central gas inlet 608. In some embodiments, the central opening 614 has a conical or funnel shape (e.g., wider opening proximate the central gas inlet 608 and narrower opening at lower portion of the central feed baffle 606). In some embodiments, an upper portion of the central feed baffle 606 includes a conical portion and the lower portion of the central feed baffle 606 includes a cylindrical portion coupled to the conical portion. The lower portion of the central feed baffle 606 extends into the interior volume 112 of the process chamber 102. In some embodiments, the lower portion of the central feed baffle 606 includes one or more radial channels 612 extending radially outward from the central opening 614 to more uniformly disperse process gases into the interior volume 112.

In some embodiments, the one or more annular plenums comprises a single plenum (e.g., outer annular plenum 208). The third conduit 122 is coupled to the outer annular plenum 208. In some embodiments, the third conduit 122 is configured to supply an inert gas to the outer annular plenum 208 and around the showerhead 158 via the plurality of holes 248. In some embodiments, the outer annular plenum 208 is disposed in an annular recess 628 disposed radially outward of the second annular channel 270. In some embodiments, the annular recess 628 includes a first annular seal 632 and a second annular seal 634 on either sides of the outer annular plenum 208 to seal the outer annular plenum 208. The annular cap 246 may be disposed in the annular recess 628 to cover and seal the outer annular plenum 208. In some embodiments, the annular cap 246 is coupled to the body 178 via a plurality of fasteners 618.

In some embodiments, an inner liner 642 is provided between the showerhead 158 and the heated lid 110 radially inward of the plurality of holes 248 to contain the one or more process gases delivered to the interior volume 112 via the central manifold 610. The inner liner 642 can have any suitable shape, for example, to keep the precursor gases delivered via the central gas inlet 608 from mixing above the showerhead 158 with the inert gas delivered via the plurality of holes 248. In some embodiments, the inner liner 642 extends into at least one of the body 178 and the showerhead 158.

Figure 8:
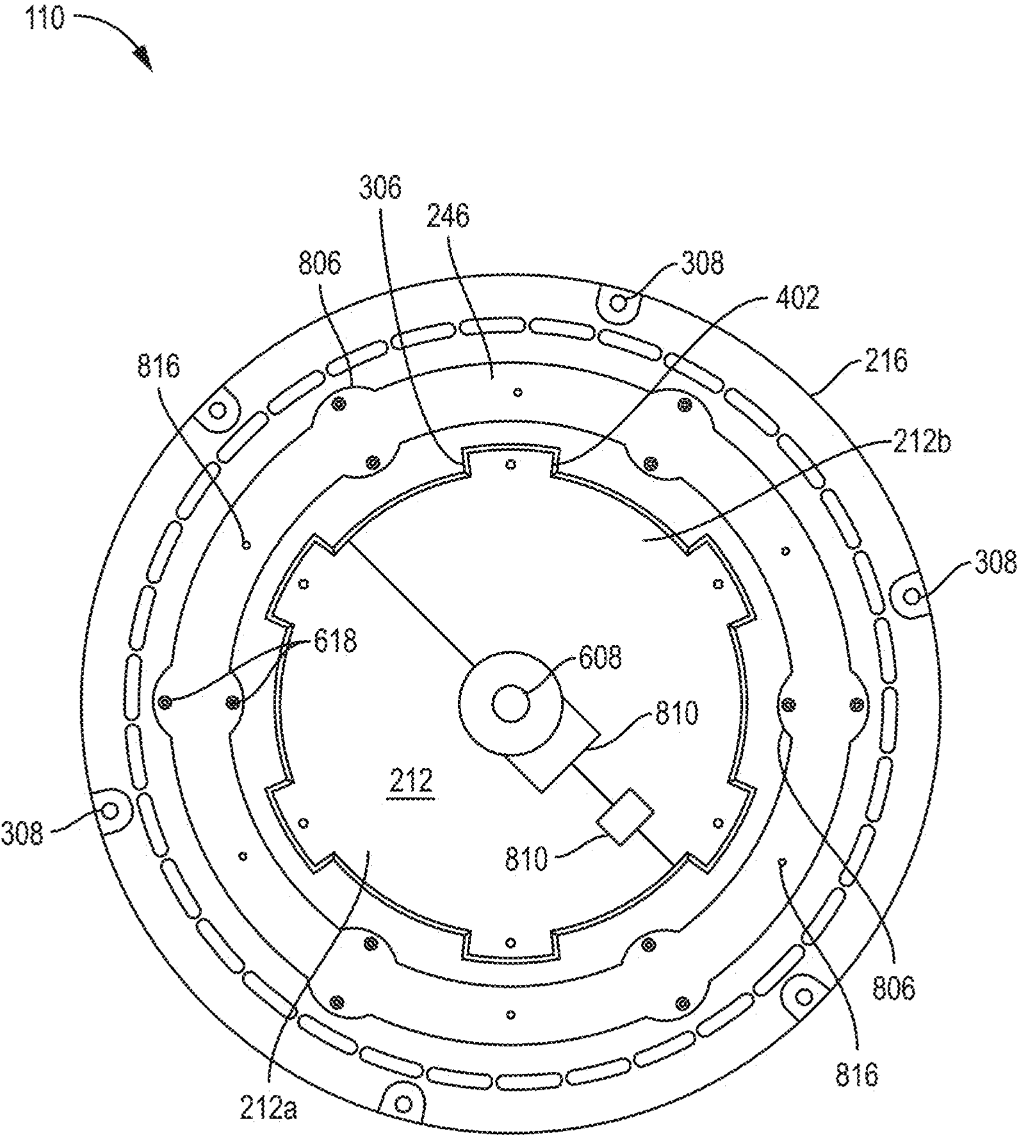
FIG. 8 depicts a top view of a heated lid with annular caps in accordance with at least some embodiments of the present disclosure.

FIG. 7 depicts a top view of a heated lid 110 without the annular cap 246 and the center cap 212 and FIG. 8 depicts a top view of the heated lid 110 with the annular cap 246 and the center cap 212 in accordance with at least some embodiments of the present disclosure. In some embodiments, a plurality of receptacles 702 may be formed in the upper surface 123 of the heated lid 110 to receive corresponding protrusions 806 from the annular cap 246. In some embodiments, the plurality of fasteners 618 are disposed at locations corresponding to the receptacles 702.

In some embodiments, the central cap 212 has a two-piece construction comprising a first portion 212*a* and a second portion 212*b*. In such embodiments, the first portion 212*a* and the second portion 212*b* are substantially similar sizes. In some embodiments, an interface between the first portion 212*a* and the second portion 212*b* is aligned with the central gas inlet 608. In some embodiments, the center cap 212 (e.g., one or more of the first portion 212*a* and the second portion 212*b*) include one or more cutouts 810 to facilitate power connections to the one or more heaters 132. In some embodiments, the third conduit 122 may be coupled to the outer annular plenum 208 in a plurality of locations along the outer annular plenum 208, via for example, openings 816 in the annular cap 246. The plurality of locations can be two or more locations, three or more locations, four or more locations, or the like. For example, and as depicted in FIG. 8, the plurality of locations can be six locations.

While the foregoing is directed to embodiments of the present disclosure, other and further embodiments of the disclosure may be devised without departing from the basic scope thereof.

The invention claimed is:

1. A heated lid for a process chamber, comprising:

a body having a central region and a peripheral region, wherein the peripheral region is thicker than the central region, wherein the body includes a central opening in the central region, wherein the peripheral region includes a plurality of vertical slots that extend into an upper surface of the body and arranged along a circle to provide a thermal break, and wherein the upper surface of the body includes an annular recess in the central region, an annular plenum that is continuous and that extends into the body from a bottom surface the annular recess, and a plurality of holes extending through a bottom surface of the annular plenum to a lower surface of the body, wherein the bottom surface of the annular recess includes a second annular recess to receive an annular seal;

a cap disposed in the annular recess to define an upper boundary of the annular plenum, wherein the cap includes one or more gas inlet holes;

a first heater ring having one or more heating elements disposed therein, wherein the first heater ring is coupled to the central region of the body; and a second heater ring having one or more heating elements disposed therein, wherein the second heater ring is coupled to the central region of the body and disposed radially outward of the first heater ring and radially inward of the annular recess.

2. The heated lid of claim 1, wherein a plurality of horizontal slots extend radially inward from an outermost sidewall of the heated lid to a location radially outward of the plurality of vertical slots and below a lower surface of the plurality of vertical slots.

3. The heated lid of claim 2, wherein the plurality of horizontal slots are arranged along two or more circular rows that are vertically spaced.

4. The heated lid of claim 2, wherein the plurality of horizontal slots are arranged in a plurality of slot clusters, and where the plurality of slot clusters are disposed at regular intervals about the body.

5. The heated lid of claim 1, wherein the plurality of vertical slots are discrete elongate slots arranged concentrically along the upper surface of the body and disposed entirely in the peripheral region.

6. The heated lid of claim 1, wherein the heated lid includes a sidewall extending downwardly in the peripheral region of the body, and wherein the plurality of vertical slots extend into the sidewall.

7. The heated lid of claim 1, further comprising a central manifold coupled to the body and having a feed block and a central feed baffle disposed in the feed block having a central opening that is conical.

8. The heated lid of claim 1, wherein the first heater ring is disposed in a first annular channel of the body and the second heater ring is disposed in a second annular channel of the body.

9. The heated lid of claim 1, further comprising a center cap that covers the first heater ring and the second heater ring.

10. The heated lid of claim 1, further comprising a first conductive ring disposed between the first heater ring and the body and a second conductive ring disposed between the second heater ring and the body.

11. The heated lid of claim 1, wherein the body, the first heater ring, and the second heater ring are made of aluminum.

12. A process chamber, comprising:

a chamber body; and the heated lid of claim 1 coupled to the chamber body, wherein the chamber body and the heated lid define an interior volume therein.

13. The process chamber of claim 12, further comprising a gas supply fluidly coupled to the one or more gas inlet holes.

14. The process chamber of claim 12, wherein the body of the heated lid includes a plurality of horizontal slots extending from an outer sidewall of the body of the heated lid to a location radially outward of the plurality of vertical slots.

15. The process chamber of claim 12, further comprising an O-ring disposed between the chamber body and the heated lid.

16. The process chamber of claim 12, further comprising a remote plasma source coupled to the central opening of the heated lid.

* * * * *